(12) United States Patent
Britton et al.

(10) Patent No.: US 9,601,604 B2
(45) Date of Patent: Mar. 21, 2017

(54) CURRENT SWITCHING TRANSISTOR

(71) Applicant: PST SENSORS (PROPRIETARY) LIMITED, Cape Town (ZA)

(72) Inventors: David Thomas Britton, Cape Town (ZA); Margit Haerting, Mowbray (ZA); Stanley Douglas Walton, Green Point (ZA)

(73) Assignee: PST Sensors (Proprietary) Limited, Cape Town (ZA)

( * ) Notice: Subject to any disclaimer, the term of this patent is extended or adjusted under 35 U.S.C. 154(b) by 0 days.

(21) Appl. No.: 14/430,585

(22) PCT Filed: Sep. 20, 2013

(86) PCT No.: PCT/IB2013/058692
§ 371 (c)(1),
(2) Date: Mar. 24, 2015

(87) PCT Pub. No.: WO2014/049500
PCT Pub. Date: Apr. 3, 2014

(65) Prior Publication Data
US 2015/0236140 A1  Aug. 20, 2015

(30) Foreign Application Priority Data

Sep. 25, 2012 (ZA) ................................ 2012/07163

(51) Int. Cl.
*H01L 29/00* (2006.01)
*H01L 29/70* (2006.01)
(Continued)

(52) U.S. Cl.
CPC ............ *H01L 29/705* (2013.01); *H01L 29/04* (2013.01); *H01L 29/0692* (2013.01)

(58) Field of Classification Search
CPC ... H01L 29/705; H01L 29/0692; H01L 29/04; H01C 7/1006; H01C 7/18; H01C 7/102
See application file for complete search history.

(56) References Cited

U.S. PATENT DOCUMENTS 3,951,694 A * 4/1976 Monfret ......................... 257/263
4,519,942 A * 5/1985 Yamaoka et al. ......... 252/520.21
(Continued)

FOREIGN PATENT DOCUMENTS

DE 3004736 A1 8/1980
JP 1-146305 A 6/1989
(Continued)

*Primary Examiner* — Nikolay Yushin
(74) *Attorney, Agent, or Firm* — Whitham, Curtis & Cook, P.C.

(57) ABSTRACT

An electronic device and a method of fabricating an electronic device are disclosed. The device includes a body of semiconductor material, and a conductive material defining at least three conducting contacts to form respective terminals. The semiconductor material and the conducting contacts overlap at least partially to define the device, so that the electrical characteristics of the device between any pair of terminals correspond to those of a varistor. The body of semiconductor material may be a layer deposited by printing or coating. The varistor characteristics between each pair of terminals enable switching of an electrical current between one terminal and any two other terminals in such a manner that when there is a positive current into a first terminal, there is a negligible current through a second terminal at which a positive potential is applied and a positive current out of a third terminal which is held at a negative potential with respect to the second terminal. When there is a negative current outwards of the first terminal, there is a positive current into the second terminal and a negligible current through the third terminal.

19 Claims, 11 Drawing Sheets

(51) Int. Cl.
*H01L 29/04* (2006.01)
*H01L 29/06* (2006.01)

(56) References Cited

U.S. PATENT DOCUMENTS

| | | | | |
|---|---|---|---|---|
| 5,066,105 | A * | 11/1991 | Yoshimoto | G02F 1/1365 345/58 |
| 5,119,062 | A * | 6/1992 | Nakamura | H01C 7/10 338/20 |
| 5,412,357 | A * | 5/1995 | Nakamura | H03H 1/02 333/181 |
| 7,705,709 | B2 * | 4/2010 | Saito | H01C 7/102 338/20 |
| 8,183,504 | B2 * | 5/2012 | Montoya | H01C 1/148 219/494 |
| 8,531,068 | B2 * | 9/2013 | Tanaka et al. | 310/68 B |
| 2007/0223169 | A1 | 9/2007 | Saito et al. | |
| 2010/0159259 | A1 * | 6/2010 | Kosowsky | H01L 27/1021 428/457 |
| 2011/0132645 | A1 | 6/2011 | Shi et al. | |
| 2011/0148258 | A1 | 6/2011 | Tanaka et al. | |

FOREIGN PATENT DOCUMENTS

| | | | | |
|---|---|---|---|---|
| JP | 2001-023805 | * | 1/2001 | H01C 7/10 |
| JP | 2005-340301 | A | 12/2008 | |
| WO | 2008010437 | A1 | 1/2008 | |
| WO | 2009129188 | A1 | 10/2009 | |
| WO | 2010110909 | A1 | 9/2010 | |
| WO | 2011106751 | A1 | 9/2011 | |

* cited by examiner

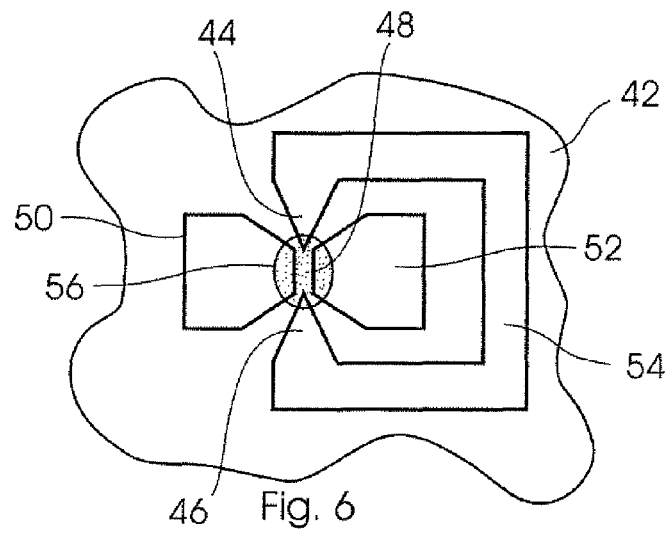
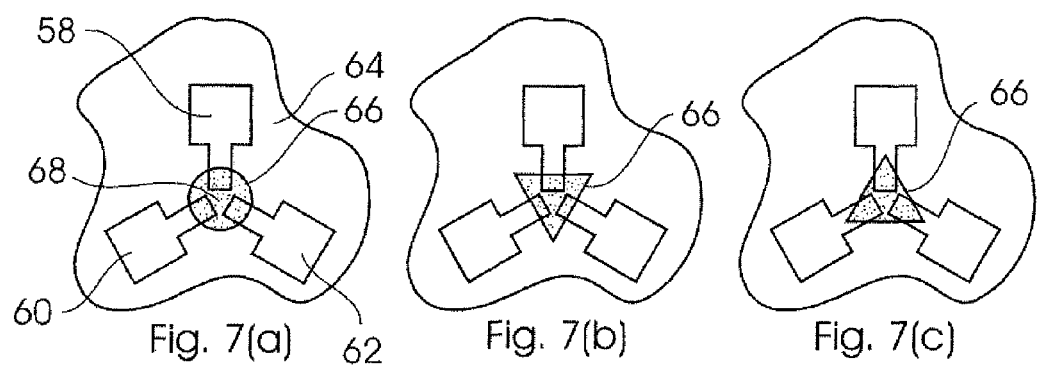
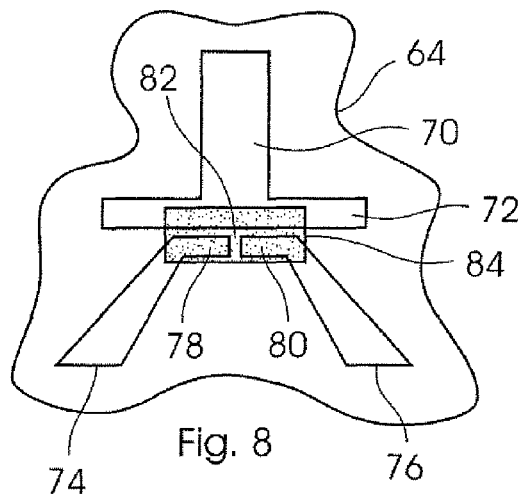

CURRENT SWITCHING TRANSISTOR

BACKGROUND OF THE INVENTION

THIS invention relates to an electronic device, in particular a transistor, and to methods of fabricating such a device.

This invention further relates to the field of printed electronics, which is the fabrication of electronic devices and circuitry using printing, coating and packaging techniques.

Transistors, being electronic devices which exhibit a transconductance or transresistance, are well known in the art. Commonly transistors are divided into two classes: junction transistors and field effect transistors (FETs). The principle of operation of the FET and a design for a junction FET were first disclosed by Lilienfeld in CA 272,437 on 22 Oct. 1925, and a variation, of the insulated gate FET (IG-FET) by Bardeen in U.S. Pat. No. 2,524,033, filed on 26 Feb. 1948. The bipolar junction transistor (BJT) was first disclosed by Shockley on the same date in U.S. Pat. No. 2,569,347. Working with Brattain, Bardeen and Shockley developed the point contact transistor (PCT), which was the first industrially applicable transistor, for which they received the 1956 Nobel Prize in Physics and which was disclosed in U.S. Pat. No. 2,524,035. In essence, all subsequent transistor developments have been improvements in the architecture, fabrication or materials of the FET and BJT.

Prior art transistors work along the same principle as a triode valve, or vacuum tube, of modulating the current between two terminals or electrodes, known as the emitter and collector (junction transistors), or source and drain (FET) by the presence of current at, or the application of a potential to, a third electrode known as the base (BJT) or gate (FET). Early applications of transistors were therefore signal amplifiers, in which the modulation of a small base current in a BJT is mapped in a linear relationship onto a larger emitter-collector current. In field effect transistors the main cause of the modulation of the source-drain current is the depletion or enhancement of the number of free charge carriers in the semiconductor material by the electric field resulting from the application of a potential to the gate. These classes of transistors are therefore highly suited to switching the source-drain current on or off, and have their main application in logic circuits, memory and display switching.

In printed electronics, most developments have been on insulated gate field effect transistors, using predominantly organic semiconducting materials. For printed inorganic semiconductors most working transistors have been insulated gate FETs, for example as described by Härting et al Appl. Phys Lett 94, 19193509 (2009), and metal semiconductor junction FETs, as disclosed in U.S. Pat. No. 8,026,565. The concept of a printed bipolar junction transistor is, however, a goal which still has to be realised, and has been disclosed by Schmid et al in U.S. Pat. No. 7,432,126, for example. This focus on field effect transistors has largely been driven by the expected applications, in which transistors are employed as logic gates and display drivers, in interactive packaging, supply chain security, radio frequency identification, and marketing. Progress in developing these applications has to some extent been hindered by the complexity of the printed transistor, which requires exact control of the properties, compatibility during processing, arrangement and thickness of multiple layers of different materials.

SUMMARY OF THE INVENTION

According to one aspect of the invention there is provided a transistor comprising an electronic component or combination of electronic components with at least three terminals, the equivalent circuit of which is a triangular network of three varistors connecting the terminals, such that the electrical current between one terminal and one of any two other terminals is routed in such a manner that: when a positive current is present at the first terminal, there is a negligible current through a second terminal at which a positive potential is applied and a positive current out of the third terminal which is held at a negative potential with respect to the second terminal; and when there is a negative current, i.e. outwards of the first terminal, there is a positive current into the second terminal and negligible current through the third terminal.

According to a second aspect of the invention there is provided an electronic component comprising at least a semiconductor material and at least three conducting contacts forming terminals, in which the semiconductor material or the combination of semiconductor material and any pair of contacts imparts varistor characteristics between the terminals, which switches an electrical current between one terminal and any two other terminals in such a manner that: when there is a positive current into a first terminal, there is a negligible current through a second terminal at which a positive potential is applied and a positive current out of a third terminal which is held at a negative potential with respect to the second terminal; and when there is a negative current, i.e. outwards of the first terminal, there is a positive current into the second terminal and negligible current through the third terminal.

According to a third aspect of the invention there is provided an electronic device including a body of semiconductor material, and a conductive material defining at least three conducting contacts forming respective terminals, with the semiconductor material and the conducting contacts overlapping at least partially to define the device, so that the electrical characteristics of the device between any pair of terminals correspond to those of a varistor.

In one embodiment, the body of semiconductor material comprises a layer deposited by printing or coating.

The device may include a substrate on which the layer of semiconductor material is deposited, with the conductive material being deposited on the layer of semiconductor material.

Alternatively the device may include a substrate on which the conductive material is deposited, with the layer of semiconductor material being deposited on the conductive material.

The device preferably has varistor characteristics between each pair of terminals, which enable switching of an electrical current between one terminal and any two other terminals in such a manner that: when there is a positive current into a first terminal, there is a negligible current through a second terminal at which a positive potential is applied and a positive current out of a third terminal which is held at a negative potential with respect to the second terminal; and when there is a negative current, i.e. outwards of the first terminal, there is a positive current into the second terminal and a negligible current through the third terminal.

In one embodiment the varistor characteristics arise from identical rectifying junctions between the semiconductor material and the material forming the contacts.

In another embodiment the semiconductor material is a particulate or fine grained material and the varistor characteristics arise from a multitude of symmetric semiconductor junctions in the semiconductor material whereby the semiconductor junctions form at interfaces between particles or grains.

In a further embodiment the semiconductor material is a composite comprising at least two electrically dissimilar materials and the varistor characteristics arise from a multitude of randomly oriented or opposed rectifying junctions in the semiconductor material whereby the rectifying junctions form at the interfaces between the two materials.

The body of semiconductor material may be in the form of a plate, layer or disc with at least two terminals disposed on one side and at least one terminal disposed on another side thereof.

Alternatively the semiconductor material may be in the form of a cylinder or regular prism having a pair of opposed faces with two terminals disposed on respective opposed faces and at least one terminal disposed on a surface connecting the opposed faces.

The device may be fabricated by depositing a layer of semiconducting material on a substrate with at least three terminals disposed in a coplanar geometry on one side of the layer.

The device may include at least one further contact and a layer of insulating material disposed between the further contact and at least one of the other contacts or the body of semiconductor material, said at least one further contact forming an additional body or ground contact.

The electronic component may be produced by printing or coating.

The semiconductor material of which the electronic component is fabricated preferably comprises silicon particles.

According to a further aspect of the invention there is provided a method of fabricating an electronic device, the method including providing a body of semiconductor material, and providing at least three conducting contacts to the body of semiconductor material to form respective terminals, wherein the electrical characteristics of the device between any pair of terminals correspond to those of a varistor.

The method may include depositing on a substrate at least a first layer of semiconductor material, and depositing conductive material defining at least three conducting contacts to form respective terminals, with the semiconductor material and the conducting contacts overlapping at least partially to define the device.

The conductive material may be deposited on the substrate first, with the semiconductor material being deposited at least partially overlapping the contacts defined by the conductive material.

Alternatively, the semiconductor material may be deposited first, with the conductive material defining the contacts being deposited over the semiconductor material.

In either case, it will be appreciated that the device is essentially fabricated in a two-step deposition process.

At least one of the semiconductor material and the conductive material are preferably deposited by a printing or coating process.

Thus, it is an important aspect of the present invention that the device disclosed herein consists essentially of only the semiconductor material and the conductive contacts, and can be produced simply in only two steps using known printing, coating or thin film deposition techniques.

The method may include depositing a layer of semiconducting material on a substrate and depositing at least three terminals in a coplanar geometry on one side of the layer of semiconducting material.

Alternatively, the method may include providing a body of semiconductor material in the form of a plate, layer or disc, applying at least two terminals to one side of the body, and applying at least one terminal to another side of the body.

The method may include depositing a layer of insulating material over at least one of the other contacts or the body of semiconductor material, and applying at least one further contact to the layer of insulating material, said at least one further contact forming an additional body or ground contact.

In another embodiment, the method may include providing a body of semiconductor material in the form of a cylinder or regular prism having a pair of opposed faces, applying first and second terminals to the respective opposed faces, and applying at least one terminal to a surface connecting the opposed faces.

BRIEF DESCRIPTION OF THE DRAWINGS

FIG. 6 is a schematic diagram of a third example embodiment of a transistor according to the invention;

FIGS. 7a, 7b & 7c are schematic diagrams of three variations of a fourth example embodiment of a transistor according to the invention;

FIG. 8 is a schematic diagram of a fifth example embodiment of a transistor according to the invention;

DESCRIPTION OF EMBODIMENTS

The present invention relates to a type of electronic device and methods of fabricating such a device. In particular the invention relates to a transistor which, depending on the direction of an electric current through a first terminal of the device, acts as a two-way switch, routing the electric current through either one of a second and a third terminal.

This invention further relates to the field of printed electronics, which is the fabrication of electronic devices and circuitry using printing, coating and packaging techniques. For the purposes of this specification the term "printing" means the forming of a pattern or design on a substrate material from a liquid or colloidal ink by methods such as, but not, limited to: relief printing such as flexography or letterpress; intaglio printing such as gravure; transfer processes including pad printing and offset lithography; flat printing methods such as lithography and xerography; stencil methods such as screen printing; and non-contact printing such as ink-jet printing.

"Coating" refers to the deposition of a continuous layer of material, for example by spraying, doctor blade, slot-dye or spin coating. Such a layer may need to be subsequently patterned, for example by photolithography, mechanical or laser engraving, or etching. Packaging techniques are the other techniques commonly found in the printing and packaging industry for the addition, removal and forming of material, including but not limited to: hot and cold lamination; transfer of pre-printed elements and components; calendaring; stamping; and embossing.

It is an aspect of the present invention that the transistor disclosed herein consists essentially of only the semiconductor material and the electrical contacts, and can be produced simply in only two steps using known printing or thin film deposition techniques. As a current switching transistor, which can function at high voltages, it is therefore expected to find application in different aspects of printed logic, with particular relevance to radio frequency communication and to driving high voltage display elements such as electroluminescent displays.

The transistor disclosed herein has a principle of operation different from both field effect and junction transistors, in that when there is a current through the base, there is negligible current between the emitter and collector and in that the electric current is between the emitter and base, or between the base and collector, depending on the direction of the current through the base. For ease of comparison, an illustration of the mechanical switch analogues of the two principles of operation is shown in FIG. 1.

Figure 1A:
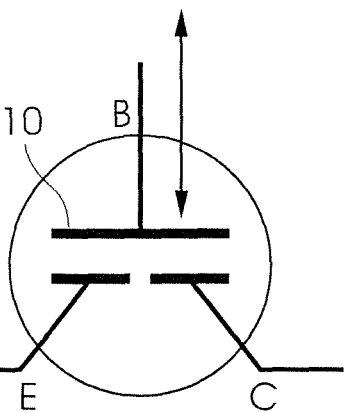
FIGS. 1a & 1b are schematic diagrams showing mechanical switch analogues of the operation of a prior art transistor and a transistor according to the invention, respectively.
Figure 1B:
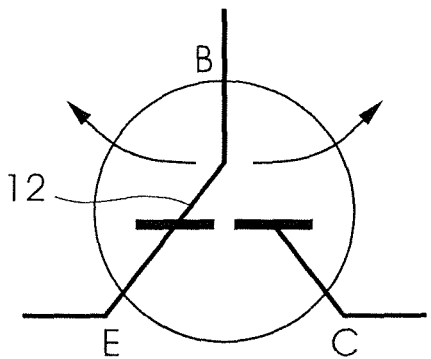

In FIGS. 1a and 1b mechanical switch analogues of transistor operation are shown schematically for a prior art BJT and a transistor of the present invention, respectively. In FIG. 1a application of a signal to the base B is equivalent to a linear motion of a plunger 10 in the direction indicated by the arrow such that a connection between the emitter E and the collector C is made or broken. In FIG. 1b a change in the direction of a current through the base B is equivalent to a rotation of a lever 12 such that a connection is made between either the base B and the emitter E or the base B and the collector C.

Thus, in the conventional transistor mode of operation shown in FIG. 1a, charge injection by a current at the base B (or application of a potential to the gate of an FET) is equivalent to a vertical motion of the plunger 10 so that it either makes or breaks the connection between the emitter E and collector C. In a transistor according the present invention, a change in the direction of the current through the base is equivalent to a rotation of the mechanical lever in FIG. 1b, so that it connects either the emitter or the collector to the base.

Figure 2:
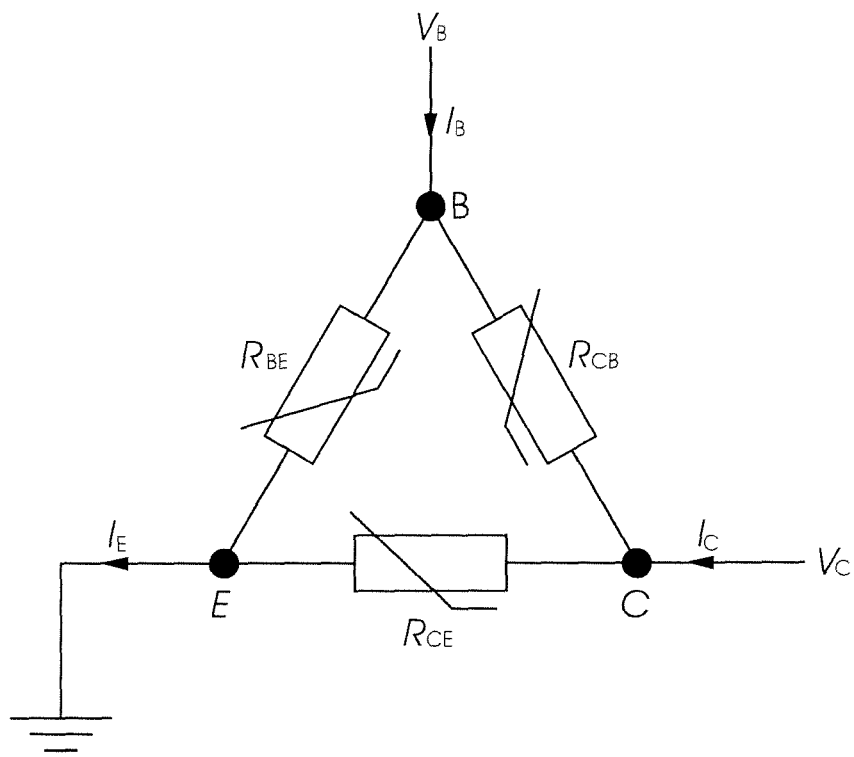
FIG. 2 is a schematic diagram showing a model of the equivalent circuit of a three terminal transistor according to an example embodiment of the invention.

A basic transistor of the present invention comprises an electronic component or combination of electronic components with at least three terminals, the equivalent circuit of which is a triangular network of three varistors connecting each pair of three terminals, as shown in FIG. 2. This Figure shows schematically a model of the equivalent circuit of the transistor, with three terminals for the base B, emitter E, and collector C, constructed with three varistors $R_{BE}$, $R_{CB}$ and $R_{CE}$ connecting each pair of terminals.

In the device of FIG. 2, the electrical current between one terminal and one of the two other terminals is routed in such a manner that: when a positive current is present at a first terminal, i.e. inwards to the first terminal, there is a negligible current through a second terminal at which a positive potential is applied and a positive current out of a third terminal which is held at a negative potential with respect to the second terminal; and when there is a negative current, i.e. outwards from the first terminal, there is a positive current into the second terminal and negligible current through the third terminal.

The required varistor characteristics between any pair of terminals are a very high electrical resistance for a low current or applied potential difference between the terminals, and a low electrical resistance for a large current or applied potential difference between the terminals. When a potential $V_C$ is applied to the collector C, and a positive current $I_B$ is injected into the base, the potential $V_B$ of the base B is large and positive with respect to the emitter E and low with respect to the collector C. Depending on the magnitude of the collector voltage $V_C$ with respect to the characteristics of the varistor connecting the collector and emitter, there may be a small current into the collector, which can be described as the off-current by analogy with other transistor types. Conversely if there is negative current at the base, meaning in the direction outwards, the base voltage $V_B$ is large and negative with respect to the collector and low with respect to the emitter. Hence the resistance $R_{CB}$ of the varistor connecting the base and collector is much lower than the resistance $R_{BE}$ of the varistor connecting the base to the emitter, and the majority current is into the collector.

Such a transistor can be simply constructed from three individual varistors connected together as shown in FIG. 2, which may be packaged together in a common housing with only three terminals or connecting leads according to any suitable methods known in electronic component manufacture. Alternatively, the transistor can be formed as an integrated circuit of at least three individual varistors on a common substrate, using any of the techniques for the deposition and patterning of material which are commonly applied in integrated circuit manufacture, thin film electronics, or printed electronics.

However, it is desirable that the transistor itself comprises only a single electronic component which is fabricated in as few steps as possible. Hence, according to preferred embodiments of the invention an electronic component is produced which comprises at least a semiconductor material and at least three conducting contacts forming terminals, which switches the electrical current between one terminal, denoted as the base, and any two other terminals, called the emitter and collector, in such a manner that: when there is a positive current into a first terminal, there is a negligible current through a second terminal at which a positive potential is applied, and a positive current out of a third terminal which is held at a negative potential with respect to the second terminal; and when there is a negative current, i.e. outwards of the first terminal, there is a positive current into the second terminal and negligible current through the third terminal.

The varistor characteristics can arise from the presence of identical rectifying junctions between the semiconductor material and the material forming the contacts.

In another embodiment the varistor characteristics arise from a multitude of symmetric semiconductor junctions in the semiconductor material which is a particulate or fine grained material whereby the semiconductor junctions form at interfaces between particles or grains.

In a further embodiment the varistor characteristics arise from a multitude of randomly oriented or opposed rectifying junctions in the semiconductor material which is a composite comprising at least two electrically dissimilar materials whereby the rectifying junctions form at the interfaces between the two materials.

The semiconductor material may be in the form of a plate, layer or disc with at least two terminals disposed on one side and at least one terminal on the other side thereof.

Two methods of achieving the desired varistor characteristics between a pair of terminals are well known in the literature. The first method is to construct identical rectifying junctions between the semiconductor material and the material forming the contacts, such that the path between any two terminals comprises a pair of identical but opposed diodes. Such a rectifying junction may be in the form of a Schottky barrier comprising an interface between the conducting material of the contact and the semiconductor material. Alternatively the rectifying junction may be a semiconductor junction between a semiconductor material of one type of conductivity and another highly doped semiconductor of the opposite conductor type, the highly doped semiconductor having an ohmic contact to the conducting material required for the electrical connection.

The second preferred method is to use a semiconductor material which has intrinsic electric field or current dependent conductivity, and which may therefore be described as a varistor material. The advantage of this approach is that it provides a free choice of the material for the contacts and electrical connections, provided that it conducts electric charge, as it is no longer necessary to provide a rectifying junction. Examples of such materials have been disclosed by Ghosh et at in WO 2012/027109, Hong et al in US 2012/0153237, and Shi et al in WO 2012/071051.

Most of these materials are composites comprising at least two electrically dissimilar materials, in which the varistor characteristics arise from a multitude of randomly oriented or opposed rectifying junctions in the semiconductor material which form at the interfaces between the two materials. An alternative is provided by a single phase material composed of silicon nanoparticles, such as those disclosed in WO 2007/0004014, which has been shown to have excellent varistor characteristics suitable for application as a thermistor in WO 2012/035494. In such single phase particulate or fine grained materials, the varistor characteristics arise from a multitude of symmetric semiconductor junctions in the semiconductor material which form at the interfaces between particles or grains.

Figure 3A:
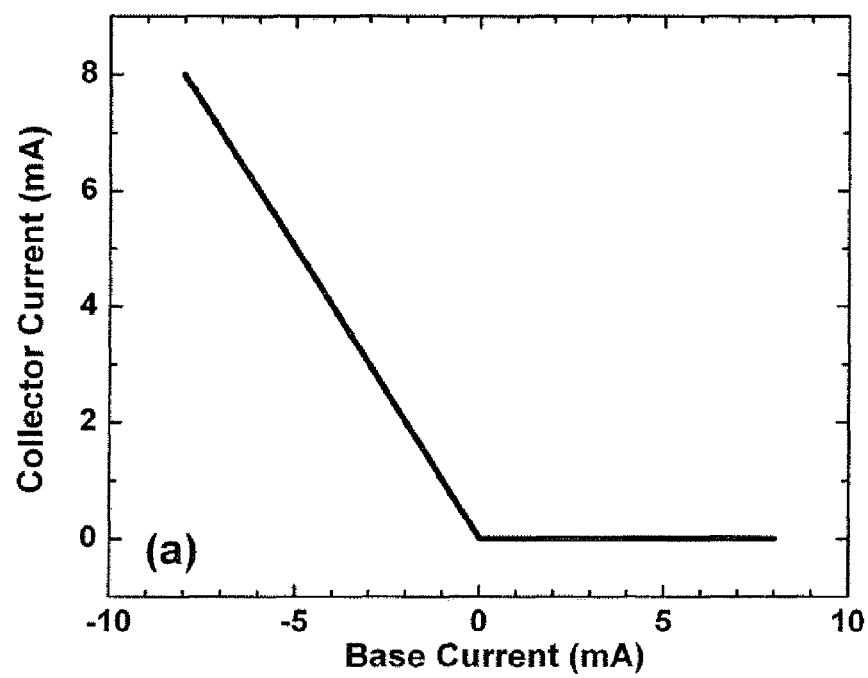
FIG. 3a is a plot of the transfer characteristics of a device corresponding to the model transistor circuit of FIG. 2, showing the dependence of the collector current on the base current for a collector potential of 100V.
Figure 3B:
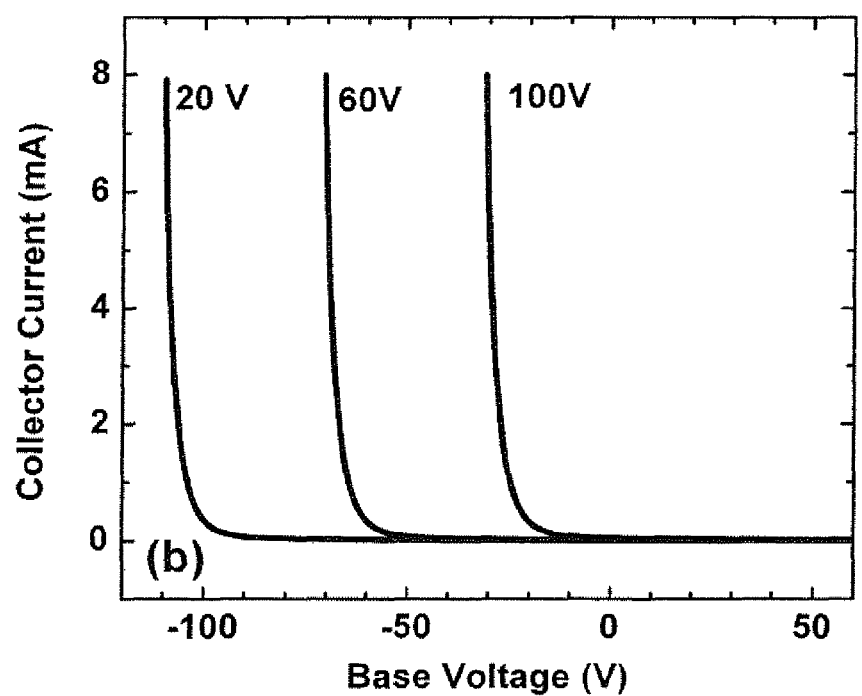
FIG. 3b is a plot of the transfer characteristics of the same device showing the dependence of the collector current on the base potential for collector potentials of 20V, 60V and 100V.

A first example embodiment of the invention is a model circuit constructed using three individual varistors of the type SIOV-S14K75, manufactured by TDK EPCOS, connected together in the circuit shown in FIG. 2. The circuit has three terminals denoted as the base B, emitter E, and collector C. The measured transfer characteristics are shown in FIG. 3a for the collector current $I_C$ as a function of base current $I_B$ for a collector potential of 100V, and in FIG. 3b as a function of base voltage $V_B$ for collector potentials of 20V, 60V and 100V. The current-current transfer characteristics show a near perfect switching behaviour with a linear response of negative slope slightly less than unity for negative base current, and a low off-current for positive base current. Also, as seen in FIG. 3b there is a well-defined base potential at which the current switches, and this switch-on voltage is dependent on the potential applied to the collector. A device of this construction could therefore also be used as an almost unity gain amplifier/attenuator or as an inverter. Further applications include rectification, filtering and signal processing, enabled by the separation of negative signals to the collector and positive signals to the emitter.

A second embodiment of the invention is a monolithic construction of the transistor as an individual component comprising a body of semiconductor material and at least three conducting contacts forming the base, emitter and collector terminals. As examples two possible constructions are shown in FIG. 4 and FIG. 5.

Figure 4:
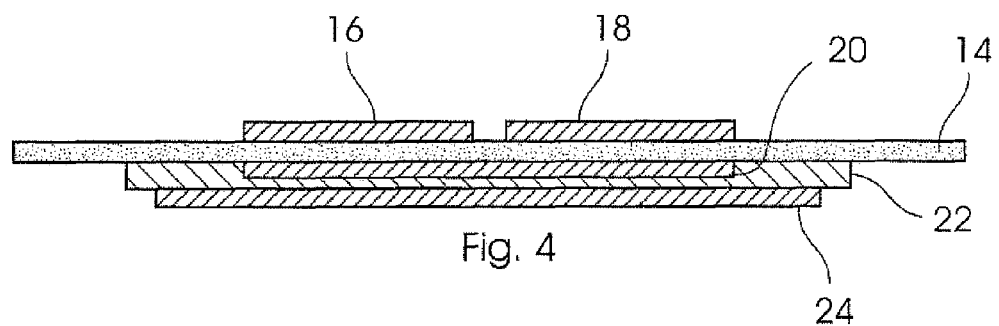
FIG. 4 is a schematic diagram of a first example embodiment of a transistor according to the invention.
Figure 5:
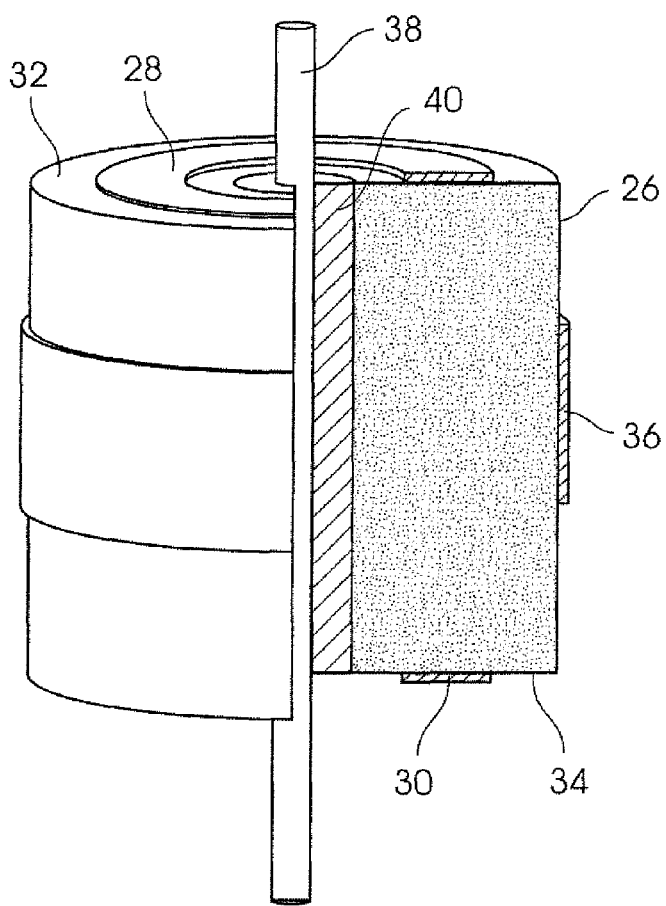
FIG. 5 is a schematic diagram of a second example embodiment of a transistor according to the invention.

In FIG. 4 a semiconductor body 14 comprises a flat sheet in the form of a plate or disc or a layer of material. Spaced apart adjacent emitter and collector terminals 16 and 18 are applied to an upper surface of the semiconductor body 14, while a base terminal 20 is applied to an opposed lower surface of the body. As illustrated, the body 14 may extend beyond the area occupied by the contacts.

Since the base contact 20 is on the opposite side of the body from the emitter contact 16 and the collector 18, which are adjacent to one another, the path encompassing the varistors defined between the base and either the collector or the emitter is through the thickness of the body, whereas the path between the collector and emitter is in a lateral direction close to the upper surface of the body. This geometry therefore automatically ensures a higher resistance between the emitter and collector, for the same potential difference, than between either the emitter or collector and the base, and hence a relatively small off-current.

An insulating layer 22 is applied to the lower surface of the body 14, covering the base contact 20, and an additional conducting contact 24 is applied to the exposed surface of the insulating layer. This contact 24 serves to provide a body or ground terminal for the transistor.

An alternative construction of the second embodiment, shown in FIG. 5, comprises a body 26 of semiconductor material in the form of a cylinder or regular prism with opposed annular emitter and collector terminals 28 and 30 disposed on respective opposed end faces 32 and 34 of the body, and at least one base terminal 36 on the cylindrical surface connecting the two end faces. The base terminal 36 may comprise a single circumferential contact completely encircling the body 26, as shown in FIG. 5, or may comprise one or more individual contacts distributed at different positions on the surface of the body.

An auxiliary contact 38 which extends axially through the body 26 is separated from the semiconducting material of the body by a coaxial sleeve or cylinder 40, and is equivalent to the contact 24 in FIG. 4, being usable as a body or ground terminal.

The ground terminal may be constructed to completely enclose the device, thereby forming a housing, or alternatively may be applied as an additional feature, for example as an underlying conductive layer or contact 24 as shown in FIG. 4, or as a conducting coaxial core 38 as shown in FIG. 5.

Preferred embodiments of the invention are those which can be fabricated by printing or thin film deposition processes onto a substrate in a limited number of steps. In general this suggests the adoption of a coplanar geometry of the contacts with the material for the emitter, base and collector contacts deposited at the same time and disposed on the same side of the semiconductor layer. However for particular applications, for example if high currents are required, it may be desirable to adopt a staggered or opposed geometry similar to that in FIG. 4, in which either the insulating layer 22 comprises a substrate composed of an insulating material such as a polymer film or fibrous material such as paper or textile, or the ground terminal 24 comprises a substrate composed of a conducting material such as a metal foil.

FIG. 6 shows a third example embodiment of the invention in which the conducting contacts are disposed in a coplanar geometry, and which is preferably fabricated by printing. In this embodiment there is provided a substrate 42 with a non-conducting surface, which may be composed of an insulating material or, alternatively, a conducting or semiconducting material with a layer of insulating material which covers at least the portion of the surface upon which the device is fabricated.

From the device perspective there is no restriction on the choice of substrate material or its dimensions, except that it has to be suitable for the deposition methods utilised and the field of application. Ideally, for the applications envisaged in the printed electronics sector, the substrate material is a flexible or rigid sheet material which may be a continuous film, a woven or a non-woven fibrous material, or a composite of the foregoing.

Examples of film materials are: polymers including, but not limited to, polyethylene terephthalate (PET), polyethylene (PE), polycarbonate, polyethylene napthalate (PEN), polyimide (kapton, vespel), cellulose derivatives such as cellulose acetate and cellulose acetate butyrate (CAB), and phenol and alkyl epoxy resins; and metals including, but not limited to, ferrous metals such as steel and stainless steel alloys, copper and its alloys, aluminium and its alloys, titanium and its alloys, and magnesium and its alloys.

Fibrous materials include: woven and non-woven fabrics of synthetic fibres and of natural fibres of animal, vegetable, or mineral origin, such as wool, cotton, linen, or stone wool (rock wool); traditional paper and board, produced from vegetable fibres, and paper-like materials such as aramid papers like Du Pont Nomex, and ceramic papers.

Composite substrate materials include: fibre and particle reinforced polymers and metals, including, but not limited to, those with nanoscale fillers such as nanoparticles, nanotubes, nanowires and nanorods of any material and intercalated nanoclays; natural materials such as wood; reconstituted wood such as superwood or chipboard; laminated sheets; and film or fibrous sheets with a continuous or textured coating applied to at least one surface.

For other applications or production processes, such as thin film deposition or microelectronics fabrication, the substrate material may also comprise crystalline or amorphous oxides, silicates and titanates, such as sodium glass, borosilicate glass, quartz, barium titanate or sapphire, or a semiconductor, including but not limited to, silicon, germanium, or compound semiconductors such as gallium arsenide, indium phosphide or copper indium selenide.

It will be appreciated that the above examples are not intended to be exhaustive or limiting.

Conducting contacts for the base, emitter, and collector are deposited on the insulating surface of the substrate 42 and formed into a pattern in which two opposed electrical contacts 44 and 46 defining the base are disposed at opposite ends of a narrow elongate gap 48 separating contacts 50 and 52 for the emitter and collector, respectively. The two base contacts 44 and 46 are connected by a path 54 of conducting material which encircles the collector contact 52. It can be seen from FIG. 6 that the base contacts 44 and 46 have triangular tapered tips which determine the length of the gap 48. The construction of the illustrated device is symmetric with respect to the emitter and collector, and hence these may be freely interchanged.

It is preferable that the deposition and patterning of the conducting material defining the contacts should occur in the same processing step, for example by the printing of a conducting ink or by physical or chemical vapour deposition through a mask. In the case of a printed device, suitable materials for the contacts are inks containing metal or carbon, which may be in microscopic or nanostructured form, but inks containing other conducting materials such as oxides of indium, tin, zinc and antimony, or organic conductors such as PEDOT:PSS may equally be applied. For a device in which the semiconductor material is to be deposited by thin film deposition, the choice of metal may be restricted by the combination required to provide a rectifying junction with the semiconductor. Generally therefore, high work function metals including molybdenum, palladium, titanium, tungsten, nickel or alloys thereof, or alternatively metals and alloys with an intermediate work function such as silver, copper, or tin, may be preferred.

A semiconductor body 56 is then deposited and patterned so that it covers the gap between all four contacts 44, 46, 50 and 52 and has mirror symmetry about the axis of the gap 48 extending through the base contacts. The body 56 is large enough to overlap the innermost ends of the contacts adjacent the gap 448.

As the areas of semiconductor material overlying the contacts have no influence on the electrical characteristics, being shunted by the conducting material, in an alternative to this design, the semiconductor material may be restricted to a pattern comprising five tracks which bridge each of the five gaps between the conductors (i.e. emitter to base (top), collector to base (top), emitter to base (bottom), collector to base (bottom), and emitter to collector.) It is also preferable that the deposition and patterning of the semiconductor body occur in a single step, for example by printing of a semiconducting ink or by physical or chemical vapour deposition through a mask.

In a printed device, inks which form varistor materials on drying or curing are preferred over those which form homogeneous semiconductors, because these place no restriction on the choice of the material for the conducting parts of the device. A preferred material is an ink comprising silicon particles, which are preferably nanoparticles with specific surface properties as disclosed in WO 2007/0004014, which through their use in thermistors, disclosed in WO 2012/035494, have been demonstrated to form a varistor material. Alternatively an organic semiconducting material, such as P3HT or PEDOT, may be used, because although they are not normally varistor materials these materials generally form a rectifying junction with most common metals.

In an alternative process, the order of deposition may be reversed so that the semiconductor body is first deposited on the substrate, and in the final construction is positioned between the terminals and the substrate.

A fourth example embodiment of the invention, which may be produced by printing, thin film deposition or conventional semiconductor fabrication techniques on a substrate material with an insulating surface, comprises only three terminals which contact the semiconductor body, and which are arranged in a symmetric pattern. This embodiment addresses difficulties in integrating the embodiment of FIG. 6 into a circuit, in that the conductor 54 which extends between the base terminals 44 and 46 restricts access to the central collector terminal 52. Consequently at least two further processing steps, for example creating a via by the deposition of an insulating material and a conducting material, are necessary to complete any circuit. In the fourth embodiment, access in the plane of the substrate is open to all terminals, enabling the electrical connections to be laid down in the same processing step as the terminals. Additionally the symmetry of the design allows all three terminals to be freely interchanged in the circuit layout. Three design examples of this embodiment, each with the appropriate symmetry, are shown in FIGS. 7a, 7b and 7c.

Three symmetrically arranged electrical contacts 58, 60 and 62, to be used as the base, emitter, and collector are deposited and patterned on a substrate 64. The materials and processes to be used are otherwise the same as in the embodiment of FIG. 6. A semiconductor body 66 is then deposited and patterned over a generally triangular gap 68 defined between adjacent inner ends of the terminals 58, 60 and 62 into a design with three-fold rotational symmetry which connects all three terminals equally.

Preferred shapes for the deposited semiconductor material 66 are, as shown respectively in FIGS. 7a, 7b and 7c: a circle, an equilateral triangle with the sides thereof extending over and making electrical contact with the inner ends of the contacts, and an equilateral triangle with the vertices thereof extending over the inner ends of the contacts. As in the previous embodiment, the body 66 comprising a solid layer or sheet of semiconductor material may be replaced by curved or straight tracks in the correct orientation and position between the terminals. The choice of semiconductor material and fabrication method is the same as in the previous embodiment, and the order of deposition of the conducting and semiconducting materials may be reversed.

The symmetrical design of the fourth embodiment shown in FIGS. 7a to 7c may be distorted to enable a variation of the resistances between each pair of terminals, but there is limited flexibility in the design. A fifth embodiment, which can be fabricated using the same materials and processes as for the previous two embodiments, allows more precise control of these parameters. In this embodiment, shown in FIG. 8, a base contact 70 has a T shape, with the head 72 of the T being elongated. The emitter and collector contacts 74 and 76 have respective inwardly extending rectangularly shaped end portions 78 and 80 which are symmetrically disposed adjacent one another and adjacent the head 72 of the base terminal so that one edge of each end portion 78, 80 is parallel to the adjacent side edge of the base terminal, and opposed edges of the emitter and collector end portions extend parallel to one another with a gap between them. Overall, a T shaped gap 82 exists between the respective contacts.

To minimise parasitic resistances and stray capacitances, the outer terminal portions of the emitter and collector contacts 74 and 76 extend at an angle away from each other. After a semiconductor body 84 has been deposited to cover all three gaps, the relative resistances of the varistors in the equivalent circuit are determined solely by the lengths of the end portions 78 and 80 of the emitter and collector contacts and the length of the gap between the pairs of contacts. This design thus allows asymmetric resistance values for the emitter-base, base-collector, and emitter-collector channels.

EXAMPLES

Figure 9:
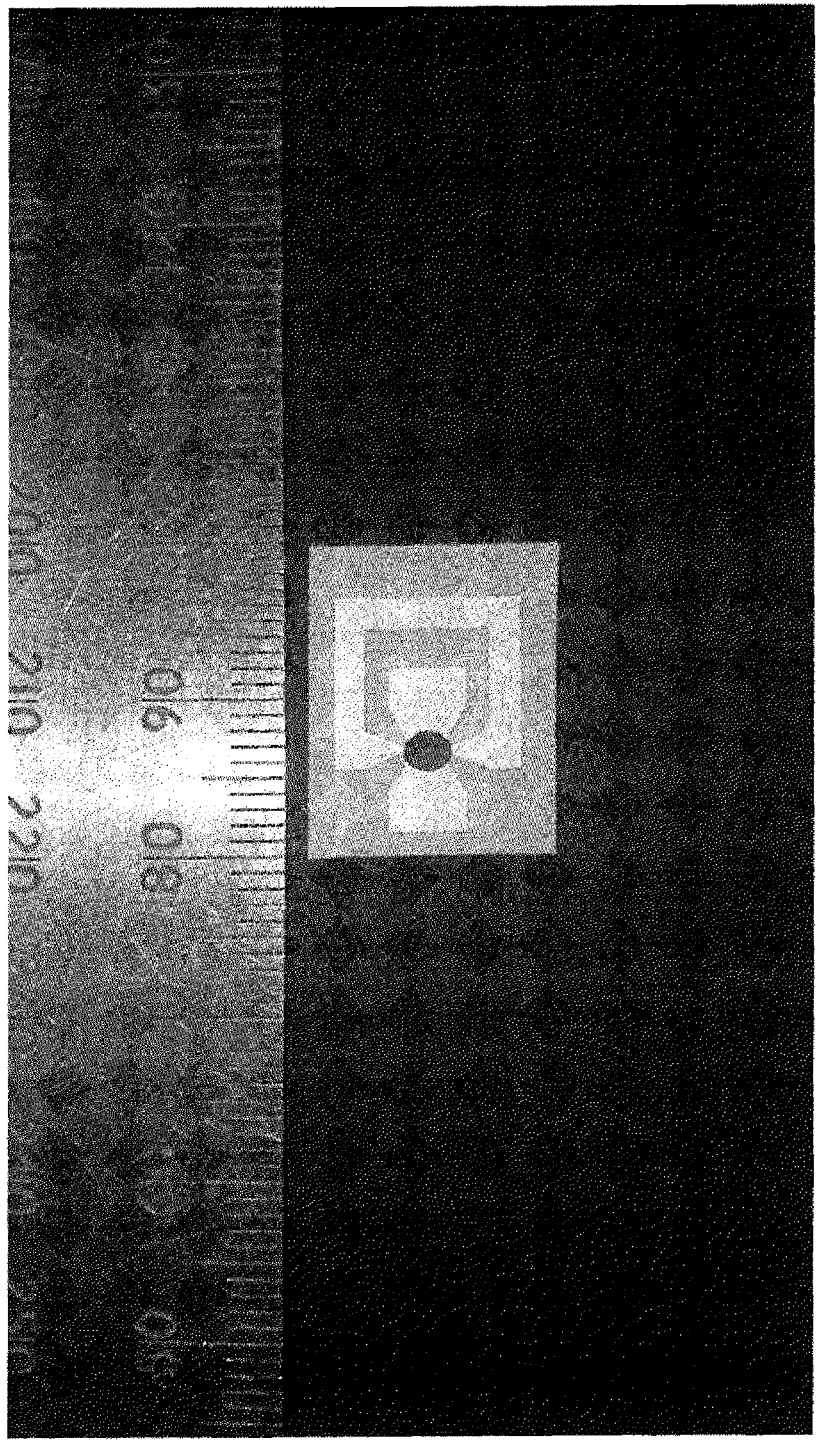
FIG. 9 is a photograph of a prototype version of a transistor corresponding to the third example embodiment shown in FIG. 6.

FIG. 9 shows a photograph of a prototype transistor of the third embodiment (FIG. 6) which has been produced by screen printing of conducting and semiconducting inks. The substrate comprises uncoated wood-free paper of weight 80 gram per square metre. Other examples of this embodiment were also fabricated on 160 gsm uncoated paper board and on 100 micron PET.

The contacts and other conducting parts of the device are printed using Du Pont Luxprint 5000 silver conductor. Similar devices have been produced in which the contacts have been printed with silver and silver alloy inks sourced from other manufacturers, including Creative Materials Inc. and PChem Inc.; and also using Du Pont 7162 Luxprint translucent conductor, which provides a semiconducting material with a constant electric field-independent resistivity.

The semiconducting pattern was printed using an ink comprising silicon nanoparticles and an acrylic binder. The silicon nanoparticles employed were of the type disclosed in WO 2007/0004014 and were produced using the milling method disclosed in WO 2009/125370 from boron-doped p-type silicon feedstock of resistivity lower than 0.005 Ohm cm, provided by Siltronix. Other inks employed were also prepared from n-type silicon feedstock of similar resistivity, provided by Siltronix, and from 2503 grade silicon metal provided by Silicon Smelters (Pty) Ltd.

Figure 10A:
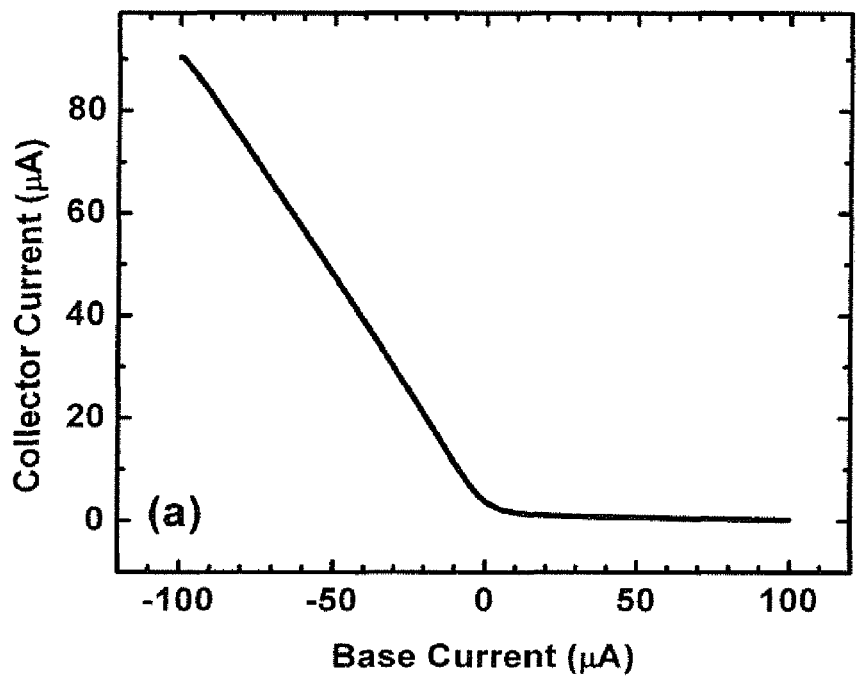
FIGS. 10 to 12 are graphs showing the transfer functions of prototype transistors as shown in FIG. 9, fabricated using different materials.
Figure 10B:
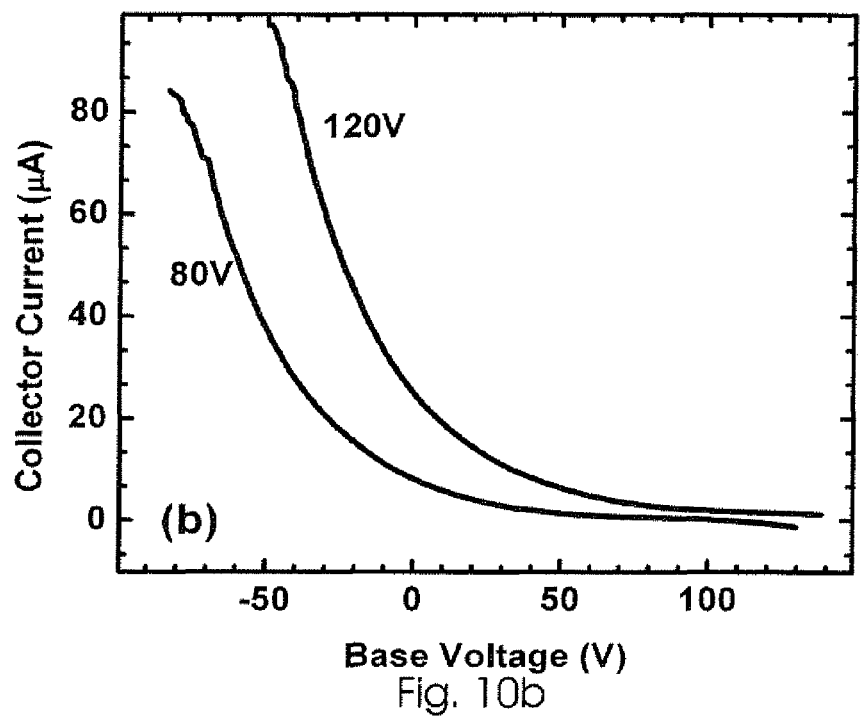

FIGS. 10 and 11 show the transfer characteristics for transistors of this embodiment which have been printed using inks comprising p- and n-type silicon nanoparticles and silver contacts, with the dependence of the collector current on the base current shown in FIG. 10a, and its dependence on the base voltage shown in FIG. 10b. In FIG. 11, a fit to a model function, which describes the collector current in terms of the potential differences across each of the three varistors in the equivalent circuit (i.e. between each pair of terminals), is also shown.

More specifically, FIG. 10 shows the transfer characteristics of a transistor according to the third embodiment which has been fabricated by screen printing of silver contacts and a p-type silicon semiconductor onto a plain paper substrate, showing the dependence of the collector current on the base current for a collector potential of 100V (FIG. 10a), and on the base potential for collector potentials of 80 V and 120 V (FIG. 10b).

Figure 11A:
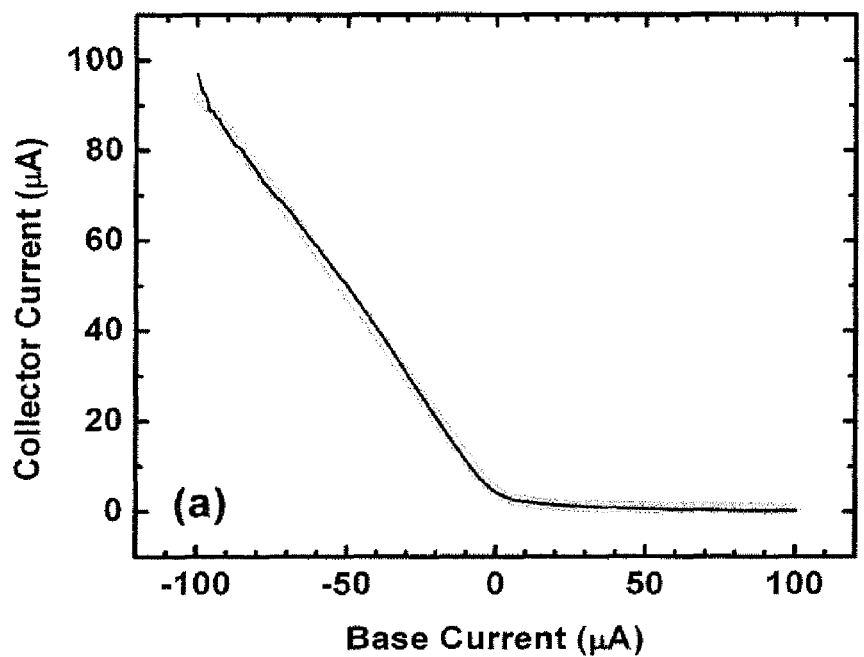
Figure 11B:
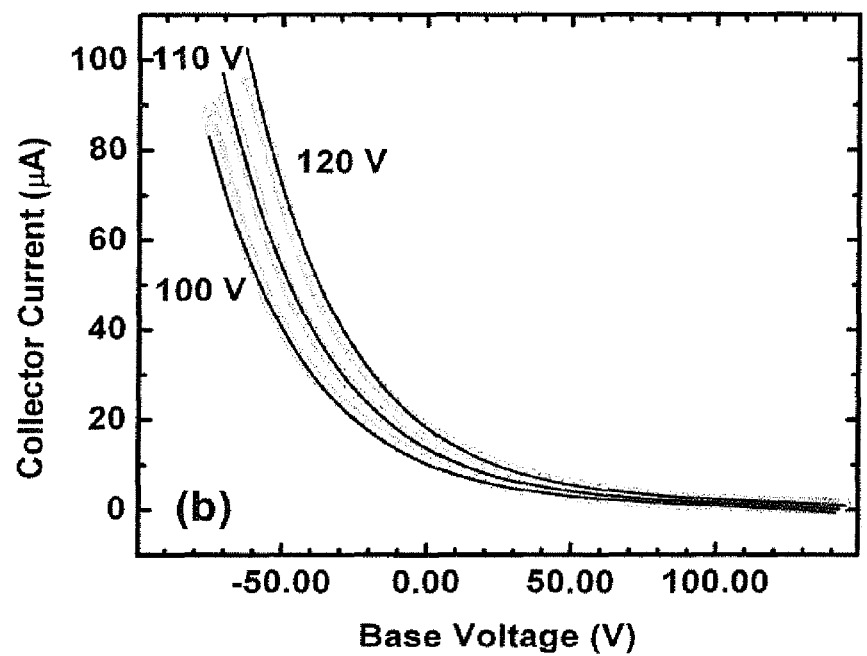

FIG. 11 shows the transfer characteristics of a transistor according to the third embodiment which has been fabricated by screen printing of silver contacts and an n-type silicon semiconductor onto a plain paper substrate, showing the dependence of the collector current on the base current for a collector potential of 110 V (FIG. 11a), and on the base potential for collector potentials of 100 V, 110 V and 120 V (FIG. 11b). The solid lines in both FIGS. 11a and b are a fit to a model function describing the dependence of the collector current on the base and collector potentials.

FIG. 12 shows similar data for an otherwise similar transistor with contacts printed using Du Pont 7162 translucent conductor and p-type silicon ink. The transfer characteristics for all three devices are similar to those of the model transistor constructed from individual components (FIG. 3), with a linear dependence of the collector current on the base current when this is negative, and a small off-current when the base current is positive.

Figure 12A:
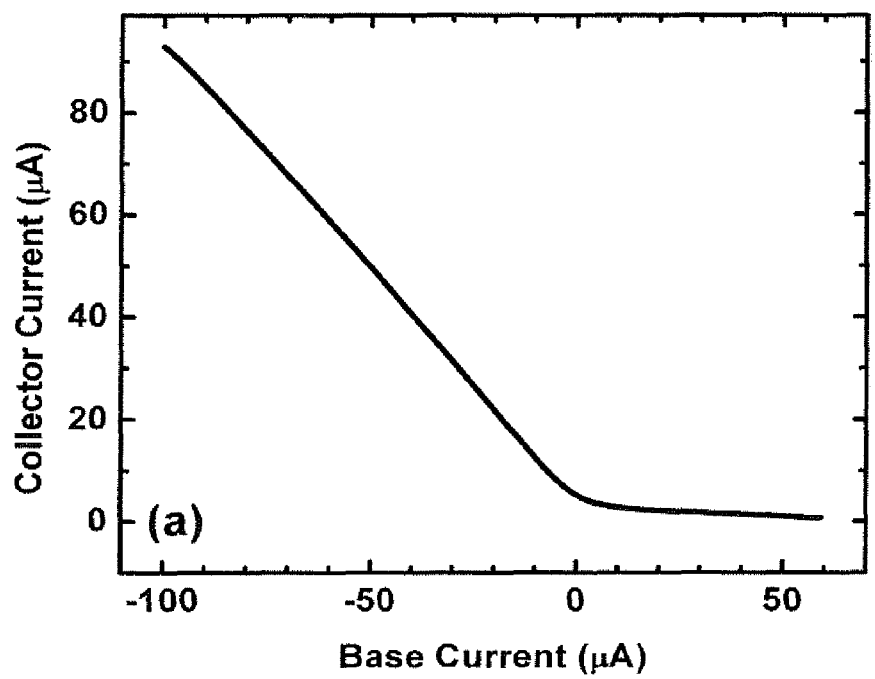
Figure 12B:
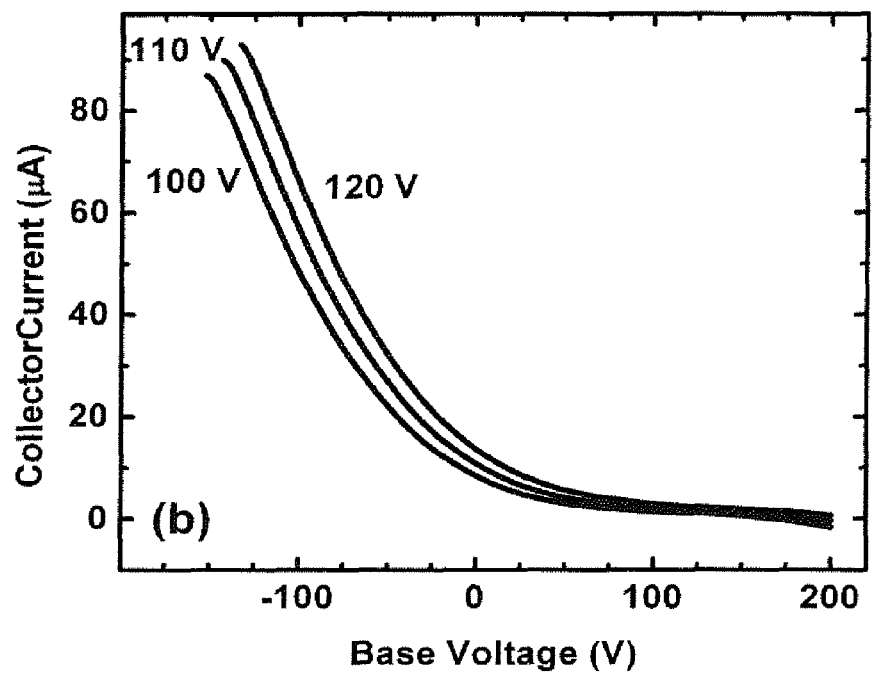

More specifically, FIG. 12 shows the transfer characteristics of a transistor according to the third embodiment which has been fabricated by screen printing of translucent conducting oxide contacts and a p-type silicon semiconductor onto a plain paper substrate, showing the dependence of the collector current on the base current for a collector potential of 120 V (FIG. 12a) and on the base potential for collector potentials of 100 V, 110 V and 120 V (FIG. 12b).

Figure 13:
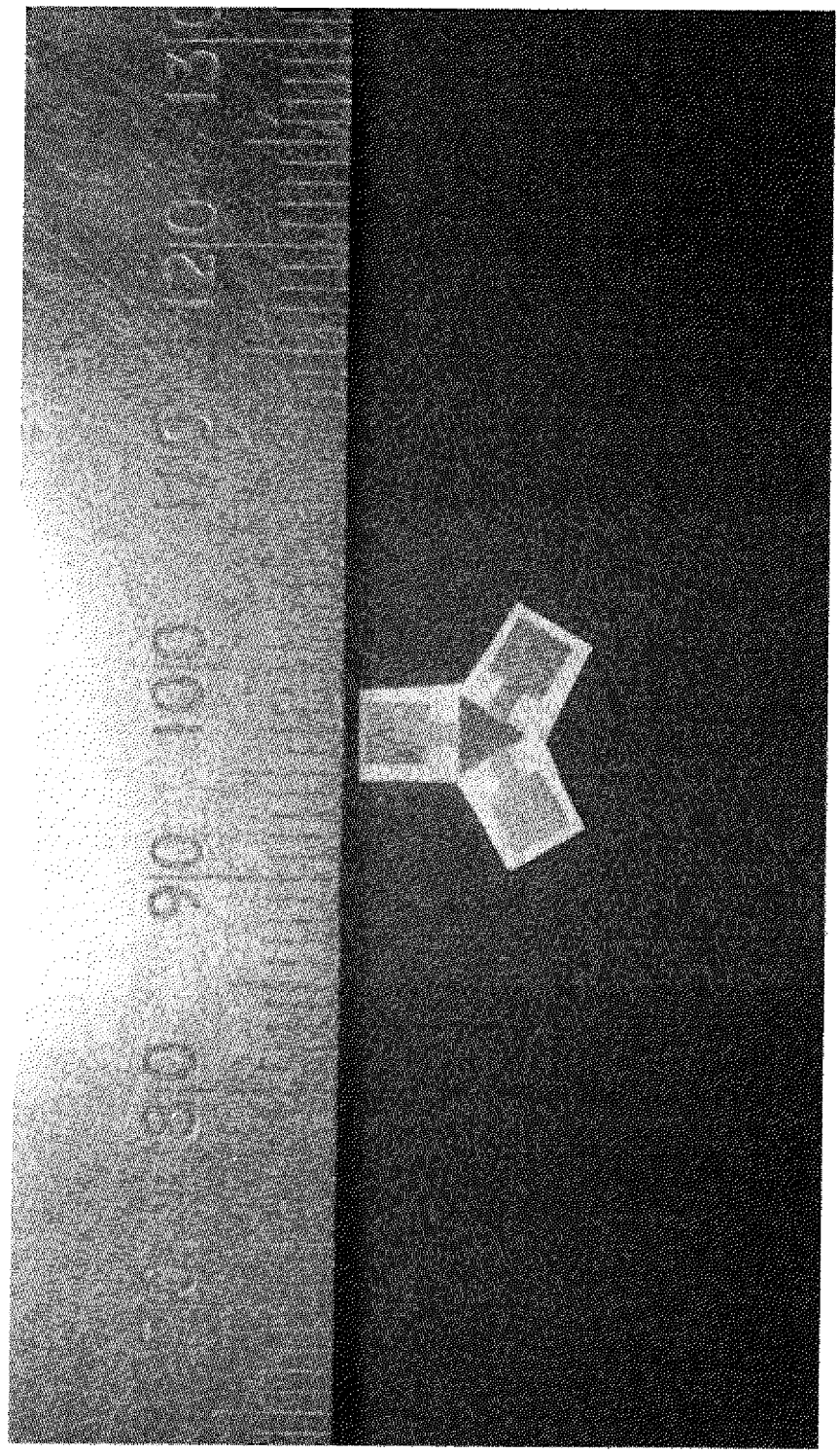
FIG. 13 is a photograph of a prototype version of a transistor corresponding to the fourth example embodiment shown in FIG. 7b.

FIG. 13 shows a photograph of a transistor of the fourth embodiment of FIGS. 7a to c which has been produced by screen printing of silver and p-type silicon inks onto an uncoated wood-free plain paper substrate of weight 80 gram per square meter. Other examples of this embodiment were also fabricated using the materials described in the previous examples.

Figure 14A:
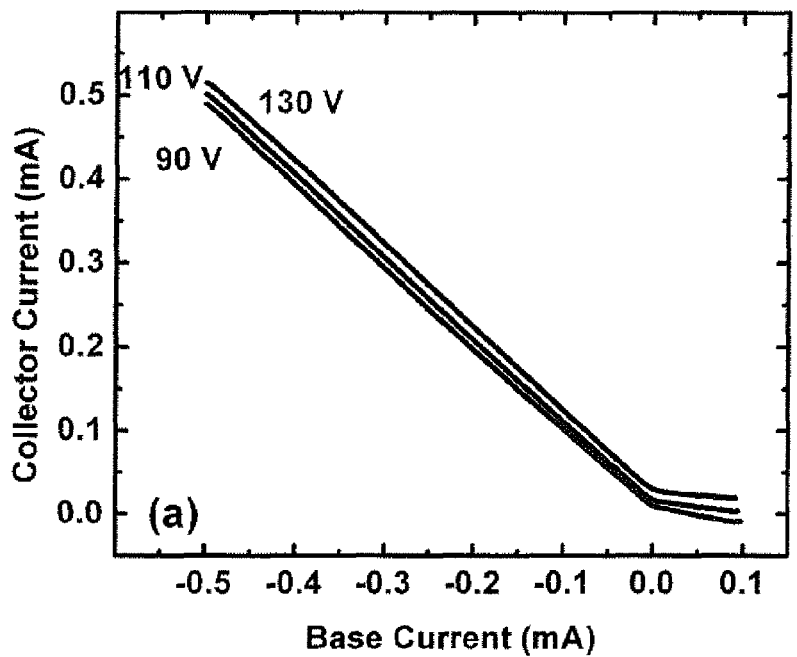
FIGS. 14a & 14b are graphs showing the transfer functions of a prototype transistors as shown in FIG. 13.
Figure 14B:
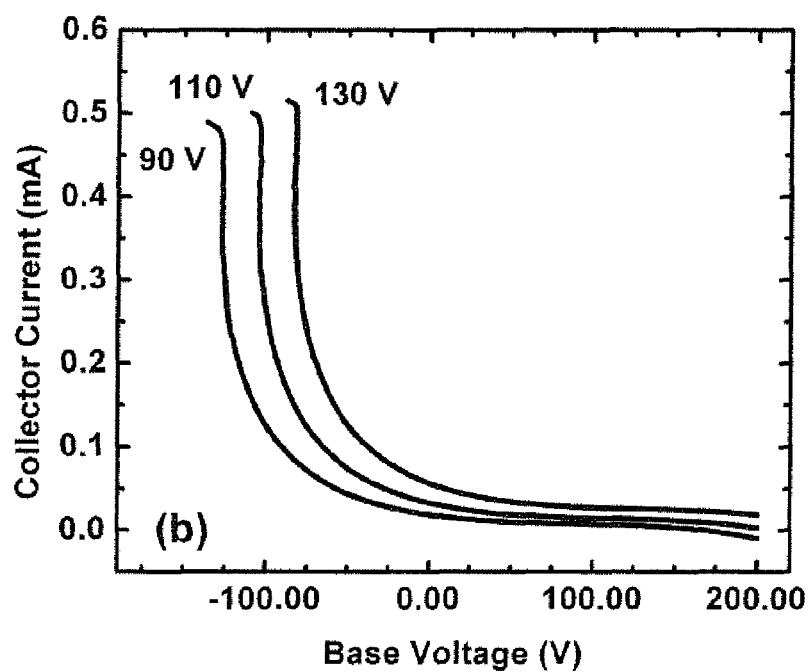

FIG. 14 shows the current-current (FIG. 14a) and current-voltage (FIG. 14b) transfer characteristics for a transistor of the fourth embodiment shown in FIG. 7b, which are broadly similar to those of the previous embodiment, with a linear dependence of the collector current on the negative base current, but with a slightly higher off-current which shows a weak linear dependence on the positive base current. However, the symmetrical construction results in a better defined base potential at which the current is switched, seen by higher slope in the current-voltage transfer characteristic curves (FIG. 14b), than for the asymmetric design. This switch-on voltage is dependent on the potential applied to the collector.

More specifically FIG. 14 shows the transfer characteristics of a transistor according to the fourth embodiment which has been fabricated by screen printing of silver contacts and a p-type silicon semiconductor onto a plain paper substrate, showing the dependence of the collector current on the base current for a collector potentials of 90 V, 110 V, and 130 V (FIG. 14a), and on the base potential for collector potentials of 90 V, 110 V, and 130 V (FIG. 14b).

Figure 15:
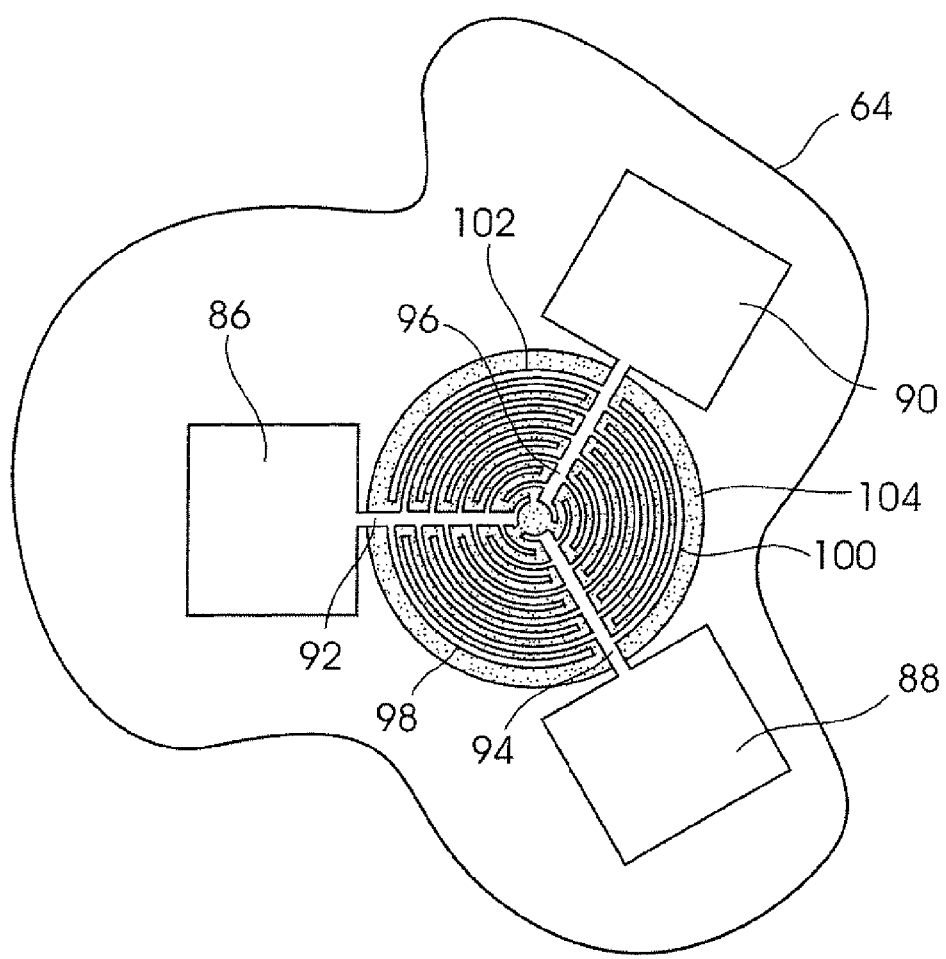
FIG. 15 is a schematic diagram of a sixth example embodiment of a transistor according to the invention.

FIG. 15 shows a sixth example embodiment of the invention which combines features of the fourth and fifth embodiments.

Conductive base, emitter and collector terminals 86, 88 and 90 are printed on the substrate 64, which has an insulating surface. Each contact has a respective inwardly extending conductive track 92, 94 and 96, defining three axes oriented at 120 degrees to each other. Extending on either side of each track 92, 94 and 96 are sets of concentrically curved interdigitated contacts 98, 100 and 102. The pattern of terminals and interdigitated contacts is deposited on the substrate using any of the materials and processes described in the previous embodiments.

The contacts 98, 100 and 102 may form a series of part-circular arcs, as shown in FIG. 15, or may be sections of a polygon with three-fold symmetry such as a triangle or hexagon. A semiconductor body 104 is then deposited to bridge the gaps between the contacts in the same manner as previously described. Alternatively the order of deposition may be reversed so that the semiconductor pattern is between the contacts and the substrate.

Advantageously, the relative resistances of the varistors between each pair of terminals can then be freely varied by altering the length, width and number of semiconductor bridges between the conducting contacts, while maintaining the three-fold symmetry and easy access to the three terminals.

The invention claimed is:

1. An electronic device consisting of:
   a body of semiconductor material, and
   a conductive material defining at least three conducting contacts forming respective terminals,
   wherein the semiconductor material and the conductive material are in contact with each other and overlapping at least partially to define the device,
   wherein the electrical characteristics of the device between any pair of terminals correspond to those of a varistor, which enables switching of an electrical current between one terminal and any two other terminals in such a manner that:
   when a current is applied inwards to a first terminal, there is a negligible current through a second terminal to which a positive potential is applied and a current out of a third terminal which is held at a negative potential with respect to the second terminal; and
   when a current is applied outwards of the first terminal, there is a positive current into the second terminal and a negligible current through the third terminal.

2. The electronic device of claim 1 wherein the body of semiconductor material comprises a layer deposited by printing or coating.

3. The electronic device of claim 1 including a substrate on which the layer of semiconductor material is deposited, with the conductive material being deposited on the layer of semiconductor material, or a substrate on which the conductive material is deposited, with the layer of semiconductor material being deposited on the conductive material.

4. The electronic device of claim 1 wherein the varistor characteristics arise from identical rectifying junctions between the semiconductor material and the conductive material forming the contacts.

5. The electronic device of claim 1 wherein the semiconductor material is a particulate or fine grained material and the varistor characteristics arise from a multitude of symmetric semiconductor junctions in the semiconductor material whereby the semiconductor junctions form at interfaces between particles or grains.

6. The electronic device of claim 1 wherein the semiconductor material is a composite comprising at least two electrically dissimilar materials and the varistor characteristics arise from a multitude of randomly oriented or opposed rectifying junctions in the semiconductor material whereby the rectifying junctions form at the interfaces between the two materials.

7. The electronic device of claim 1 wherein the body of semiconductor material is in the form of a plate, layer or disc with at least two terminals disposed on one side and at least one terminal disposed on another side thereof.

8. The electronic device of claim 1 wherein the semiconductor material is in the form of a cylinder or regular prism having a pair of opposed faces with two terminals disposed on respective opposed faces and at least one terminal disposed on a surface connecting the opposed faces.

9. The electronic device of claim 1 comprising a layer of semiconducting material deposited on a substrate with at least three terminals disposed in a coplanar geometry on one side of the layer.

10. The electronic device of claim 1 including at least one further contact and a layer of insulating material disposed between the further contact and at least one of the other contacts or the body of semiconductor material, said at least one further contact forming an additional body or ground contact.

11. The electronic device of claim 1 wherein the body of semiconductor material comprises silicon particles.

12. The electronic device of claim 1, wherein the electrical conducting contacts are disposed in a coplanar geometry fabricated by printing on a non-conducting surface.

13. The electronic device of claim 12, wherein first and second conducting contacts are formed into a pattern in which third and fourth opposed electrical contacts are disposed at opposite ends of a narrow elongate gap separating the first and second contacts, the first and second contacts being connected by a path of conducting material which encircles the third contact and the first and second contacts have triangular tapered tips which determine a length of the narrow elongate gap, further comprising a semiconductor body deposited and patterned so that it covers the narrow elongate gap between all four contacts and has mirror symmetry about an axis of the narrow elongate gap extending through the first and second contacts, the semiconductor body being large enough to overlap innermost ends of the four contacts adjacent the narrow elongate gap.

14. The electronic device of claim 12, wherein a first electrical contact has a T shape, with the head of the T being elongated, and second and third electrical contacts have respective inwardly extending rectangularly shaped end portions which are symmetrically disposed adjacent one another and adjacent the head of the first electrical contact so that one edge of each end portion of the second and third electrical contacts is parallel to an adjacent edge of the first electrical contact and opposed edges of the second and third electrical contact end portions extend parallel to one another with a gap between them, outer portions of the second and third electrical contacts extend at an angle away from each other, further comprising a semiconductor body deposited to cover all gaps between the first, second and third electrical contacts.

15. The electronic device of claim 14, wherein the relative resistances of varistors are determined solely by the lengths of the end portions of the second and third electrical contacts and a length of a gap between pairs of contacts.

16. The electronic device of claim 12, wherein three symmetrically arranged electrical contacts are deposited and patterned on the non-conducting surface and connected to respective terminals, further comprising a semiconductor body deposited and patterned over a generally triangular gap defined between adjacent inner ends of the electrical contacts into a design with three-fold rotational symmetry which connects all three terminals equally.

17. The electronic device of claim 16, wherein the deposited semiconductor material is in the form of a circle.

18. The electronic device of claim 16, wherein the deposited semiconductor material is in the form of, an equilateral triangle with the sides thereof extending over and making electrical contact with the inner ends of the contacts.

19. The electronic device of claim 16, wherein the deposited semiconductor material is in the form of an equilateral triangle with the vertices thereof extending over inner ends of the contacts.

* * * * *